United States Patent [19]
Keck et al.

[11] Patent Number: 5,545,387
[45] Date of Patent: Aug. 13, 1996

[54] PRODUCTION OF HIGH-PURITY POLYCRYSTALLINE SILICON ROD FOR SEMICONDUCTOR APPLICATIONS

[75] Inventors: David W. Keck; Kenichi Nagai; Yoshifumi Yatsurugi, all of Moses Lake; Hiroshi Morihara, Vancouver, all of Wash.; Junji Izawa, Kanagawa, Japan

[73] Assignee: Advanced Silcon Materials, Inc., Moses Lake, Wash.

[21] Appl. No.: 488,103

[22] Filed: Jun. 7, 1995

Related U.S. Application Data

[63] Continuation of Ser. No. 296,964, Aug. 26, 1994, which is a continuation-in-part of Ser. No. 953,480, Sep. 28, 1992, Pat. No. 5,382,419.

[51] Int. Cl.$^6$ .................................................. C01B 33/02
[52] U.S. Cl. .......................... 423/348; 423/349; 264/81; 427/248.1; 118/719; 118/725
[58] Field of Search .................................. 423/348, 349; 264/81; 427/248.1; 118/719, 725

[56] References Cited

U.S. PATENT DOCUMENTS

| | | |
|---|---|---|
| 3,011,877 | 12/1961 | Schweickert . |
| 3,091,517 | 5/1963 | Short et al. . |
| 3,097,069 | 7/1963 | Reuschel et al. . |
| 3,147,141 | 9/1964 | Ishizuka . |
| 3,286,685 | 11/1966 | Sandmann et al. . |
| 3,358,638 | 12/1967 | Rummel . |
| 3,463,119 | 8/1969 | Basche . |
| 3,523,816 | 8/1970 | Cave . |
| 3,527,661 | 9/1970 | Schink et al. . |
| 3,918,396 | 11/1975 | Dietze et al. . |
| 4,125,643 | 11/1978 | Reuschel et al. . |
| 4,132,763 | 1/1979 | Schmidt et al. . |
| 4,147,814 | 4/1979 | Yatsurugi et al. . |
| 4,150,168 | 4/1979 | Yatsurugi ................................. 118/719 |
| 4,311,545 | 1/1982 | Bugl et al. . |
| 4,468,283 | 8/1984 | Ahmed . |
| 4,481,232 | 11/1984 | Olson . |
| 4,715,317 | 12/1987 | Ishizuka . |
| 4,734,297 | 3/1988 | Jacubert ................................. 427/248.1 |
| 4,805,556 | 2/1989 | Hagan ..................................... 118/725 |
| 4,826,668 | 5/1989 | Breneman et al. . |
| 4,831,974 | 5/1989 | Jacubert et al. . |
| 5,382,419 | 1/1995 | Nagai ...................................... 423/348 |

FOREIGN PATENT DOCUMENTS

| | | |
|---|---|---|
| 728584 | 2/1966 | Canada . |
| 0180397 | 10/1985 | European Pat. Off. . |
| 0181803 | 10/1985 | European Pat. Off. . |
| 0324504 | 1/1989 | European Pat. Off. . |
| 2808461 | 9/1978 | Germany . |
| 2808462 | 9/1978 | Germany . |
| 44-31717 | 12/1969 | Japan . |
| 63-123806 | 5/1988 | Japan . |

OTHER PUBLICATIONS

Blocher et al., "Survey of Options in a Balanced System for Production of Silicon by Thermal Decomposition of Trichlorosilane," Columbus Laboratories, Columbus, Ohio, pp. 140–158, published before Apr. 1, 1992.

*Primary Examiner*—Richard Bueker
*Attorney, Agent, or Firm*—Klarquist Sparkman Campbell Leigh & Whinston, LLP

[57] ABSTRACT

Disclosed are a processes and reactors for rapidly producing large diameter, high-purity polycrystalline silicon rods for semiconductor applications by the deposition of silicon from a gas containing a silane compound. The equipment includes a reactor vessel which encloses a powder catcher having a cooled surface. Also within the vessel is a cylindrical water jacket which defines multiple reaction chambers. The silicon powder generated in this process adheres to the coolest surfaces, which are those of the powder catcher, and is thereby collected. Little of the powder adheres to the walls of the reaction chambers. In some embodiments, a fan can be provided to increase gas circulation.

15 Claims, 5 Drawing Sheets

PRODUCTION OF HIGH-PURITY POLYCRYSTALLINE SILICON ROD FOR SEMICONDUCTOR APPLICATIONS

This is a continuation of application Ser. No. 296,964, filed Aug. 26, 1994, which is a continuation-in-part of application Ser. No. 953,480, filed Sep. 28, 1992, now U.S. Pat. No. 5,382,419.

BACKGROUND OF THE INVENTION

The present invention relates to a process and equipment for the production of high-purity polycrystalline silicon in rod form for semiconductor applications. The polycrystalline silicon is used as the raw material in the fabrication of single crystal silicon for semiconductors by the CZ (Czochralski) method or the FZ (float zone) method.

The most common method of producing polycrystalline silicon, which is a raw material used for the production of single crystal silicon for semiconductors, has been to deposit silicon on starter filaments by thermal decomposition of a halosilane compound, such as trichlorosilane, so as to produce large-diameter silicon rods. Japanese Patent Laid-Open No. 56-105622 discloses a reactor structure using a chloride-type silane in which a large number of electrodes are arranged on a circular plate and a large number of silicon starter filaments are arranged in a reverse-U-shaped or a square-reverse-U-shaped form.

This technique, however, is not suitable for industrial scale production of polycrystalline silicon from a silane compound, such as monosilane gas or disilane gas, which is not halogenated. At a temperature of several hundred degrees or more, monosilane gas decomposes and thereby generates a fine silicon powder. The presence of such powder causes a number of difficulties and, in particular, can seriously hinder the growth of silicon rods. Further, where the high-temperature silicon rods face each other, surface irregularities are generated, thereby deteriorating product quality.

A known technique for dealing with the above problems is disclosed in U.S. Pat. No. 4,150,168, according to which red-hot silicon starter filaments are thermally insulated from each other so as to prevent vapor-phase temperature rise and as to eliminate thermal influences from the adjacent heated silicon rods, thereby obtaining uniform silicon rods.

However, in the industrial scale production of silicon rods by thermal decomposition of monosilane, it is impossible, even with the above-mentioned technique, to reduce the silicon powder generation to zero. The generated silicon powder is deposited on the reactor walls. When it has accumulated to a thickness of several mm, the silicon powder spontaneously separates from the walls and falls, part of the falling powder contacting and adhering to the growing silicon rods. The portion of the powder which adheres to the silicon rods may lead to powder intrusion, abnormal dendrite growth or the like, resulting in defective products.

Japanese Patent Laid-Open No. 61-101410 discloses a technique which is somewhat improved over that of U.S. Pat. No. 4,150,168, in that the reactor has a different heat insulation structure. However, for reasons given in a reference by Hogness et al. (Hogness, T. R., Wilson, T. L., Johnson, W. C.: "The Thermal Decomposition of Silane" *J. Am. Chem. Soc.* 58: 108–112, 1936), the new technique is likely to require a serious decrease in reaction speed in order to obtain the restraint of the silicon powder growth.

Japanese Patent Publication No. 44-31717 discloses a technique for collecting silicon powder outside a reactor. With this technique, the silicon powder generated in the course of production of polycrystalline silicon rods is taken out of the reactor along with the partially spent reactant gas. The powder is collected by means of a filter, and the gas cleared of powder is re-circulated through the reactor. A similar technique is disclosed in U.S. Pat. No. 4,831,964. A problem with these techniques is that they require large scale equipment external to the reactor. Thus, they involve an increase in the number of components, resulting in an increase in the opportunity of contamination. Further, the silicon powder adhering to such components accumulates in places where it cannot be easily removed by cleaning or in places which are hard to clean. The silicon powder is very active, so that it is easily ignited by static electricity or the like. And, an ignition of a mixture of air and silicon powder can cause a detonation. It is another problem that silicon powder deteriorates the sealing property of valves used to isolate the reactor from the external equipment when extracting silicon rods, performing cleaning, etc. Thus, handling of the silicon powder is best kept to a minimum.

Japanese Patent Publication No. 52-36490 discloses a special method of causing a reactive gas to circulate in a reactor. The method employs a means for uniformalizing the concentration of monosilane gas in the reactor. It prevents monosilane gas at high concentration or pure monosilane gas from reaching a high-temperature section of the reactor in the vicinity of the silicon starter filaments, thereby restraining the generation of silicon powder. A problem with this method is that no measure is taken to contain the radiation of heat from the heat generating elements. Thus, the technique is not suitable for the thermal decomposition of monosilane gas. Further, because the rods are not grown in separate reaction chambers, it is difficult to supply the reactive gas in a uniform fashion. As a result, it is hard for the grown silicon rods to attain a high level of roundness in cross section, the rod diameter differing from rod to rod.

A technique for increasing the flow velocity of reactive gas is disclosed in Japanese Patent Laid-Open No. 63-123806, according to which an agitator is provided in the top or bottom section of a reactor. This technique, however, is not suitable where a nonhalogenated silane compound gas is used since silicon powder would be generated and dispersed by the agitator.

Apart from the problems discussed above, these prior techniques have a problem which is common to them: the absence of a means for preventing the silicon powder which is generated by vapor-phase homogeneous reaction, from accumulating on the walls around the silicon rods and on the reactor ceiling. Defective products result due to the adhesion of silicon powder detached from the reactor walls. Silicon rods are hard to dissolve where the silicon powder has adhered, thus making monocrystallization difficult. Therefore, silicon rods with adhered powder are suitable for neither the CZ or the FZ method.

Further, it is considered that the precipitation rate of polycrystalline silicon will be low when a reactor structure encourages the accumulation of silicon powder on the walls around growing polycrystalline silicon rods and on walls in the reactor ceiling section.

Polycrystalline silicon, in the form of rods or chunks obtained by crushing rods, is being widely used in the production of single crystal silicon by the CZ or FZ method. A high purity level and competitive cost are particularly required of polycrystalline silicon rods for semiconductor applications. These requirements are becoming severer from year to year. The present invention has been made in view of the above problems in the prior art.

Accordingly, there is a need to provide a process and equipment which make it possible to produce large diameter polycrystalline silicon rods rapidly while making efficient use of a gas feedstock that contains a nonhalogenated silane compound.

SUMMARY OF THE INVENTION

The present invention provides a process and equipment for the production of polycrystalline silicon in rod form for semiconductor applications by thermal decomposition of a highly refined reactant gas containing a nonhalogenated silane compound such as monosilane or disilane.

Walls inside a reactor define multiple reaction chambers for growing polycrystalline silicon in rod form and provide powder catchers for collecting silicon powder generated during the thermal decomposition of the silane compound. The powder catcher walls define at least one powder catcher chamber that is separate from, but communicates with, the reaction chambers. Both the reaction and powder catcher chambers define flow paths for the reactant gas.

In a first embodiment, the reactor contains a plurality of powder catchers consisting of vertically-extending cylindrical water jackets which are arranged concentrically, and multiple reaction chambers which are cylindrical channels defined by an outer cylindrical water jacket surrounding the powder catchers. The powder catcher chambers and reaction chambers communicate via spaces defined above and below the outer water jacket.

Preferably, the total cross-sectional area of the powder catcher chambers is larger than that of the reaction chambers, and the total surface area of the powder catcher walls is larger than that of the walls which define the reaction chambers. Resistant baffle plates are provided at the lower ends of the reaction chambers and at the upper or the lower ends of the powder catcher chambers for the purpose of controlling reactant gas flow; a metal or ceramic plate is installed as a heat shield plate in the top section of the reactor; and a plurality of nozzles for feeding monosilane gas into the reactor are positioned within the upper regions of the powder catcher chambers and directed circumferentially with respect to the powder catchers.

Further, in a method of producing polycrystalline silicon using the above-described equipment for the production of polycrystalline silicon in rod form for semiconductor applications, the relationship $T2 \leq T1 \leq T3$ is maintained, where T1 is the wall temperature of the reaction chambers, T2 is the wall temperature of the powder catchers, and T3 is the wall temperature of the reactor ceiling. For optimum results, temperature control is effected in such a way that T1 is b 25° C. or more, T2 is 25° C. or less, and T3 is 70° C. or more.

In other embodiments, the powder catcher is located at an elevation above the reaction chambers. The powder catcher, which most advantageously includes an array of heat exchange tubes, is preferably offset horizontally so that the tubes are not located directly above the reaction chambers. The tubes are positioned such that gas flowing from the reaction chambers flows through the array of tubes where powder deposits on the cooled surface provided by the tubes. At least a portion of the reactant gas that passes through the tubes is recirculated into the reaction chambers.

In either embodiment, a fan can be installed at a position in the reactant gas flow and, more specifically, at a position below the powder catcher(s) so as to control the reactant gas circulation in the reactor on the basis of the rotating speed of the fan. To direct the reactive gas flow to pass through the fan, a shroud can be provided to isolate the powder catcher chamber(s) and the reaction chambers from each other.

The above-described apparatuses provide one or more of the following advantages:

(1) The degree of freedom in setting the reaction conditions is substantially increased, as compared with the prior art, by virtue of a construction in which a large number of reaction chambers for growing polycrystalline silicon in rod form and one or more powder catchers for collecting silicon powder are arranged inside a common reactor vessel in such a way as to extend along a reactant gas flow path and as to be separate from each other. Since the reaction chambers and the powder catcher(s) are separated from each other and installed inside the same reactor, optimum conditions can be obtained for their respective functions. That is, by making the cooling temperature of the powder catcher(s) lower than that of the reaction chambers, the flow velocity of the descending gas is increased, with the result that the ascending speed of the gas flow in the reaction chambers is increased, thereby making it possible to increase the rate of reactant gas supply, produce large diameter polycrystalline silicon rods in a short time, and reduce production costs.

(2) When the wall surfaces of the powder catchers or the gas return passageways are vertical and the total space cross-sectional area of vertical powder catcher chambers or gas return passageways is larger than that of the reaction chambers, the resistance with respect to the downward flow of the reactant gas is reduced, thereby increasing the flow velocity of the gas flowing upwards in the reaction chambers. Accordingly, it is possible to feed a larger amount of reactant gas, thereby raising the growth speed of the polycrystalline silicon rods. Further, the adhesion of silicon powder to the reaction chamber walls can be prevented to a large degree.

(3) By making the total surface area of the powder catchers larger than that of the reaction chamber walls, the collection of silicon powder by the powder catchers is facilitated.

(4) When resistant plates for reactant gas flow control are provided at the upper ends of the reaction chambers and/or at the upper or the lower ends of vertical powder catcher chambers, it is possible to adjust the supply of gas to the reaction chambers and thereby obtain a predetermined uniform flow rate where there would otherwise be some irregularity in the gas flow pattern inside the reactor. As a result, the gas flow in the reactor is uniformalized, and the growing conditions for the polycrystalline silicon rods can be optimized.

(5) When a shield plate is provided above the reaction chambers, it is possible to maintain the ceiling section of the reactor vessel at a higher temperature, thereby more reliably preventing the adhesion of silicon powder to the ceiling section of the reactor vessel.

(6) When a plurality of feed nozzles for feeding part of the reactant gas into the reactor are arranged at a level corresponding to the upper regions of vertical powder catcher chambers and in such a way as to be directed in the circumferential direction with respect to the powder catchers, new reactant gas can be injected horizontally at an angle of 90° with respect to the downstream flow in the powder catcher chamber(s). This agitates the recirculating reactant gas and makes the overall concentration of silicon compound gas more uniform. Due to this enhancement in mixing, it is possible to feed a large amount of reactant gas under optimum gas distribution conditions. Accordingly, the growing speed of the polycrystalline silicon rods is increased.

(7) Since the temperature control can be effected in such a way that the reaction chamber wall temperature T1 is 25° C. or more, the powder-catcher wall temperature T2 is 25° C. or less, and the reactor-ceiling wall temperature T3 is 70° C. or more, the velocity of the monosilane gas, flowing downwards along the powder catcher walls, is increased, thereby increasing the velocity of the gas flowing upwards inside the reaction chambers. Due to this arrangement, reactant gas can be supplied to the reaction chambers at a high rate, thereby making it possible to produce large-diameter silicon rods in a short period of time. Further, as a result of the increase in the gas flow velocity, gas does not linger in the reaction chambers so that adhesion of silicon powder to the reaction chamber walls can be avoided. Since the temperature of the powder catcher walls is set to be lower than that of the other surfaces inside the reactor, the silicon powder collecting effect is enhanced remarkably.

(8) When a fan is provided below the powder catcher(s) and a shroud isolates the powder catcher chambers or gas return passageway(s) from the reaction chambers, the flow velocity of the gas fed into the reaction chambers can be controlled by adjusting the fan rotating speed and it is possible to further increase the rate of reactant gas feed through the reaction chambers. By adjusting the fan velocity, it is possible to achieve the optimum gas flow rate, thereby increasing the growing speed of the polycrystalline rods.

Most reactors in use nowadays are made of metal, taking into consideration equipment cost, management, safety, and the like. In the production equipment of the present invention, a nonhalogenated silane gas is used instead of a chloride-type silane gas, which is highly corrosive. Therefore, a secondary contamination of polycrystalline silicon due to corrosion of the reactor can be avoided. Further, the thermal decomposition of nonhalogenated silane compound gas is accompanied by a vapor-phase uniform decomposition, which is a reaction involving the generation of silicon powder, so that it is remarkably different from the thermal decomposition of a chloride-type silane gas. Therefore, adopting a reactor configuration which is the same as that of a reactor using a halogenated silane gas, would result in a rather low reaction speed and yield at a very low level.

DETAILED DESCRIPTION

Preferred embodiments of processes and equipment for the production of high-purity polycrystalline silicon in rod form for semiconductor applications, according to the present invention, will now be described with reference to the drawings.

Figure 1:
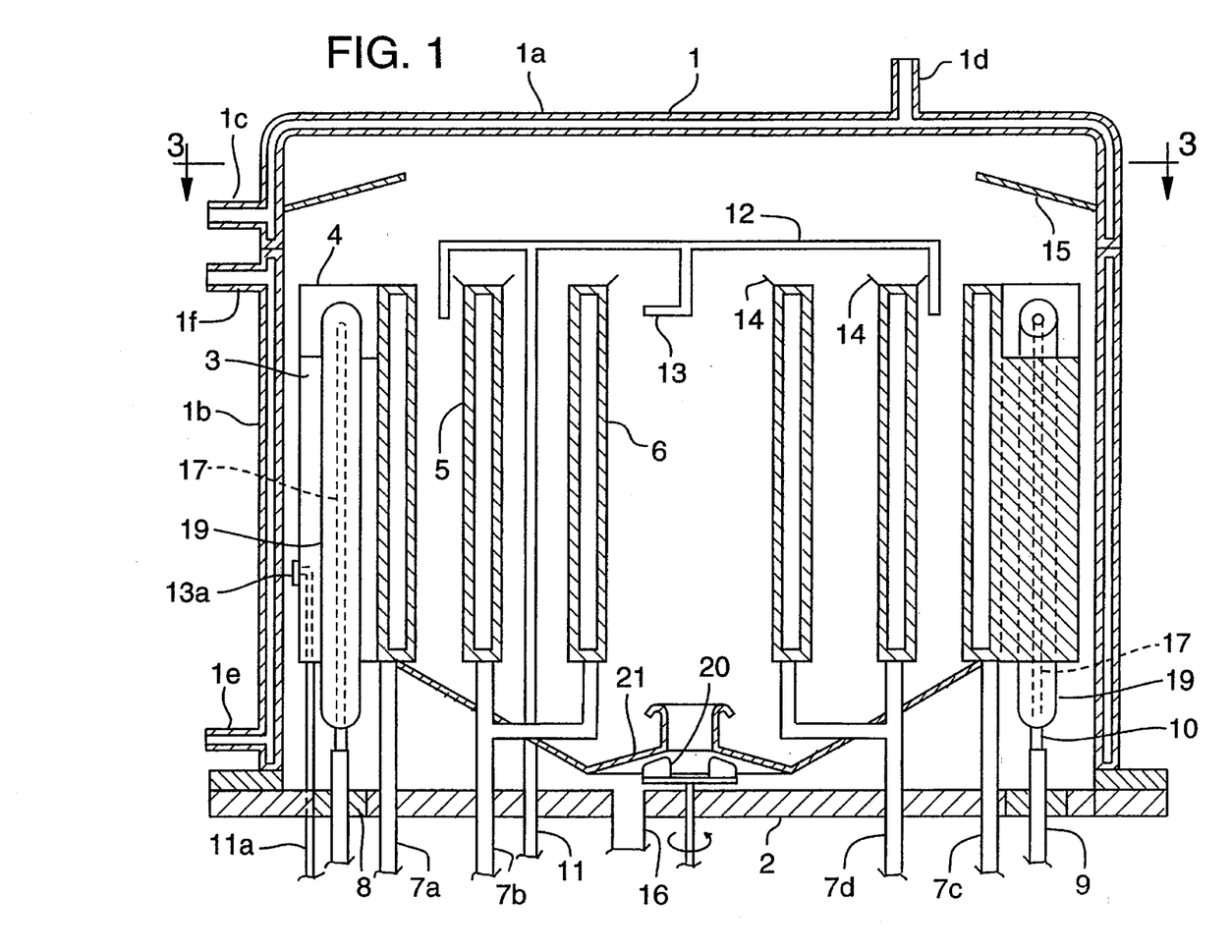
FIG. 1 is a schematic vertical sectional view showing a first reactor according to the present invention for the production of high-purity polycrystalline silicon rods for semiconductor applications.
Figure 2:
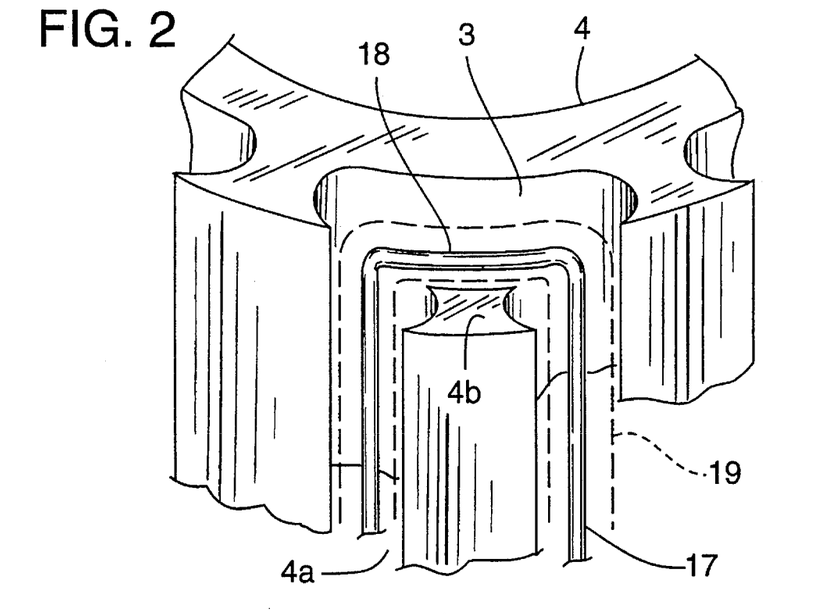
FIG. 2 is a partial perspective view showing an upper portion of a cooling jacket and of reaction chambers defined thereby.
Figure 3:
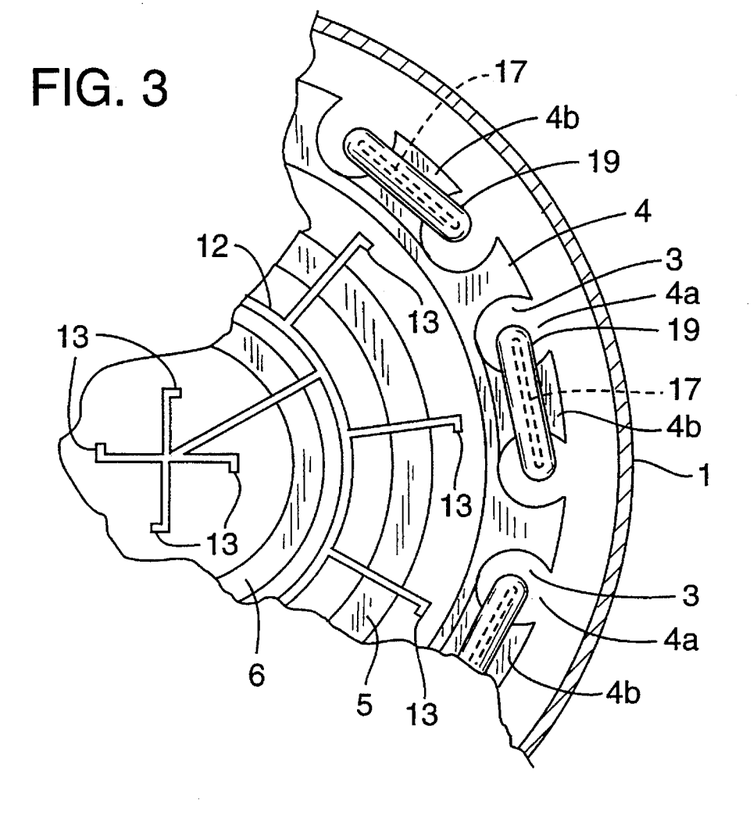
FIG. 3 is a partial schematic sectional view taken along line 3—3 of FIG. 1.

In the equipment shown in FIGS. 1–3, a verger-type cover or bell 1 and a round base plate 2 provide a reactor vessel. A cylindrical partition member 4, that is a heat exchanger or water jacket and that is shaped to define multiple reaction chambers 3, is provided inside a cylindrical space defined by the cover 1 and base plate 2. Cylindrical powder catchers 5 and 6 are concentrically arranged within the partition member 4. The water jacket 4 and powder catchers 5 and 6 are sized and spaced such that there are annular powder catcher chambers therebetween and a cylindrical powder catcher chamber at the center of the powder catcher 6. The powder catcher chambers serve as gas downflow passageways. The reaction chambers 3 consist of cylindrical spaces arranged at equal intervals in the vicinity of the outer periphery of the water jacket 4. Openings 4a leading from the outer periphery of the water jacket 4 to the reaction chambers 3 are provided for purpose of enabling the extraction of polycrystalline silicon rods which have been completely grown.

The cover 1 and the powder catchers 5 and 6 are at least partially hollow and serve as water cooled heat exchangers or cooling jackets. The cover 1 is formed by connecting upper and lower cover sections 1a and 1b with each other. The lower surface of the upper cover section 1a serves as the reactor vessel ceiling. Provided in the upper cover section 1a are a cooling water inlet 1c and a cooling water outlet 1d. Provided in the lower cover section 1b are a cooling water inlet 1e and a cooling water outlet 1f. As it moves from the inlet 1c to the outlet 1d, cooling water flows through the space between the inner and outer walls of the cover. Connected to the bottoms of the water jacket 4 and the powder catchers 5 and 6 are cooling water supply pipes 7a, 7b, 7c and 7d which extend from below through the base plate 2. The pipes 7b and 7d are used to supply cooling water to spaces inside the powder catchers 5 and 6 and to discharge it therefrom. Electrodes 9 extend from below through the base plate 2, through the intermediation of insulating members 8, and are arranged at positions corresponding to the centers of the reaction chambers 3. Chucks 10 are attached to the tips of the electrodes 9. The water flowing through the water cooling jackets may be replaced by another fluid cooling or a heating medium. Further, the powder catcher may be a bundle of pipes or of a coil type.

In the embodiment of FIG. 1, a fan 20 and a shroud 21 are provided below the powder catchers 6 to enhance and control the circulation of gas inside the reactor.

A silane gas pipe 11 extends from below through the base plate 2 and upwards between powder catchers 5 and 6. Connected to an annular header 12, which is connected to the upper end of the silane gas pipe 11, are a plurality of gas nozzles 13 which are open in the same circumferential direction. The nozzles are thus aimed to cause silane gas to move circumferentially along walls of the powder catchers 5 and 6. Provided inside each of the gas nozzles 13 is a capillary or an orifice to enable the silane gas to be ejected uniformly through the nozzles 13.

Resistant plates 14 are arranged at appropriate intervals inside the reactor. The plates extend transversely to gas downflow passageways to regulate gas flow. In the illustrated embodiment, the plates 14 are firmly attached to the upper ends of the powder catchers 5 and 6. Such resistant plates may also be firmly attached to the lower end of the water jacket 4 and/or the powder catchers 5 and 6, and/or connected to the header 12 above the powder catchers 5 and 6. Provided in the space above the water jacket 4 is a heat shield plate 15. An exhaust pipe 16 extends through the base plate 2 and can be used to remove spent reactant gas. Silane gas pipes 11a allow silane gas to be evenly ejected into each reaction chamber at an arbitrary position 13a on the water cooling jacket 4.

Next, a process for producing polycrystalline silicon rods using the above apparatus will be described. Silicon starter filaments 17 are positioned in the reaction chambers 3 and held by the chucks 10. Above each of stepped sections 4b of the water cooling jacket 4, a pair of silicon starter filaments 17 are connected to each other at their upper ends through a silicon bridge 18. Cooling water is circulated through the cover 1, the water jacket 4 and the powder catchers 5 and 6. The silicon starter filaments 17 are heated by directly supplying electricity thereto through the electrodes 9.

Reactant gas, which contains a silane gas, is fed into the reactor through the reactant gas pipes 11, the header 12 and the gas nozzles 13. Reactors according to the present invention are particularly suited for use with a reactant gas that contains silicon in the form of a nonhalogenated silane compound, such as monosilane or disilane, or a mixture of such compounds. The reactant gas, which is ejected horizontally in the circumferential direction, is agitated by a downward gas flow along the wall surfaces of the powder catchers 5 and 6. Because they are moving in different directions, the gas streams mix and are agitated to produce a combined reactant gas having a uniform concentration of the silicon-containing compound(s). Then, while ascending inside the reaction chambers 3, which are heated by the silicon starter filaments 17, the gas reacts to deposit polycrystalline silicon 19 on the silicon starter filaments 17. Reactant gas which has been blown upwards beyond the reaction chambers 3 next descends along the wall surfaces of the powder catchers 5 and 6 and then returns to the reaction chambers 3. It is advantageous to circulate reactant gas at a high flow rate so that any silicon powder will remain entrained in the gas until it reaches a cooled surface of the powder catcher. To operate at an increased gas flow rate, the reactant gas can comprise a mixture that includes one or more nonhalogenated silane compounds and a diluent, such as hydrogen gas or an inert gas such as helium or argon. And, conversely, to achieve a desired rate of silicon deposition on the rods, the rate of gas flow should be increased when the concentration of silicon-containing compounds in the reactant gas is reduced. The diluent gas is preferably mixed, using mass flow controllers to maintain a desired ratio, with the silane-containing gas before the reactant gas is injected into the reactor. However, it would be possible to have a separate set of injection nozzles (not shown) for injection of the diluent gas.

To inhibit uneven growth in the diameter of the polycrystalline silicon rods at different elevations, a supplementary stream of reactant gas can be provided through the reactant gas pipe 11a and the gas nozzle 13a. The added gas makes up for the depletion of silane from the reactant gas that moves upwardly in the reaction chambers 3.

The powder catchers 5 and 6 perform the two functions of collecting silicon powder and effecting heat exchange. Accordingly, the temperature in the reaction chambers 3 can be independently regulated to achieve the best growth conditions for polycrystalline silicon rods.

If the regions surrounding the powder catchers 5 and 6 are cooled to a temperature lower than that of other regions inside the reactor, the velocity of downward gas flow along the powder catchers 5 and 6 is increased, with the result that the velocity of the upwards flow in the reaction chambers 3 is increased. As a result, it is possible to circulate a large volume of silane-containing gas through the reactor chambers 3. Further, since floating silicon powder collects on cool surfaces, such as on the walls of the powder catchers 5 and 6, accumulation thereof on the walls of the reaction chambers 3 and the reactor ceiling section can be avoided to a large degree.

Because of the multi-layer structure in the horizontal direction of the powder catchers, it is possible to enhance the cooling effect and the collection of the silicon powder while suppressing resistance to downward gas flow. However, it is difficult to attach a plurality of powder catchers while maintaining a high degree of concentricity thereof. If the gaps between the powder catchers are not uniform, the reactant gas cannot flow uniformly into the different sections of the reactor. To compensate for uneven spacing, the resistant plates or baffles 14 are attached to the bottom section of the water cooling jacket 4 and to the top or the bottom sections of the powder catchers 5 and 6 for the purpose of controlling the gas flow. The width, length and mounting angle of the resistant plates 14 are selected to achieve optimum results. The resistant plates 14 can also be used to control any turbulence in the gas flow caused by supports or like structures attached to the water jacket 4 or the powder catchers 5 and 6 due to any requirement in strength.

It is especially important to maintain the relationship: $T2 \leq T1 \leq T3$, where T1 is the wall temperature of the reaction chambers 3, T2 is the wall temperature of the powder catchers 5 and 6, and T3 is the wall temperature of the upper section of the verger-type cover 1. By making the wall temperature T3 of the reactor ceiling section high, the adhesion of silicon powder to the ceiling section further decreases.

It is desirable that the wall temperature T1 of the reaction chambers 3 be 25° C. or more. Further, the temperature of the lower cover section 1b opposed to the reaction chambers 3 is also set to be 25° C. or more. A cooling water at a temperature of 30° C. to 40° C. can be easily obtained by utilizing equipment such as a cooling tower. It is desirable for the wall temperature T2 of the powder catchers 5 and 6 to be 25° C. or less. Also in this regard, a cooling water at a temperature of 10° C. to 15° C. can be easily achieved by directly utilizing water drawn from a well. Cooling water at a temperature of approximately 5° C. can be easily supplied by utilizing equipment such as a chiller.

It has been experimentally ascertained that circulating silicon powder is most likely to adhere to and accumulate on surfaces of the lowest temperature. The lower the temperature, the greater the amount of adhesion. A cooling water temperature around 5° C. is desirable for the powder catchers 5 and 6 for powder removal efficiency. It is desirable that the wall temperature of the reactor ceiling section, i.e., the temperature T3 of the upper cover section 1a, be 70° C. or more. When using water, the phenomenon of boiling may take place at a mean water temperature of around 85° C., depending upon the conditions, so that it is more desirable to use a heating medium other than water when a temperature of 85° C. or more is involved. When the difference between the temperatures T1 and T3 becomes approximately 30° C. or more, the effect of preventing the silicon powder adhesion to the reactor ceiling section becomes remarkably high.

By installing the heat shield plate 15 above the reaction chambers 3 and keeping the walls in the region above the reaction chambers 3, to which silicon powder should not adhere, at high temperature, little silicon powder adheres in this region. The heat shield plate 15 may consist of a polished metal plate having high reflectance, for example, a stainless steel plate, which excels in heat resistance and corrosion resistance. A ceramic plate excelling in heat resistance, such as a quartz glass plate, may also be used for the heat shield plate 15. The plate 15 may be annular or a series of separate plates.

While, in the embodiment described above, the reaction chambers 3 are formed as cylindrical spaces having vertical openings through the outer peripheral surface of the water jacket 4, from which the grown polycrystalline silicon rods are extracted, this should not be construed restrictively. It is also possible to form the reaction chambers as completely cylindrical spaces having no such openings, the grown polycrystalline silicon rods being extracted by pulling them upwards out of the reaction chambers. Further, it is also possible to provide reaction chambers on both the outer and the inner peripheral surfaces of the water jacket 4. Or, the water jacket that is equipped with reaction chambers may be provided in a central region of the reactor, with the powder catchers arranged around it.

When the fan 20 is used, its rotating drive shaft extends through the base plate 2 and connects to a driving motor (not shown). To prevent the escape of silane gas, which is inclined to ignite spontaneously upon coming into contact with air, a shaft seal or insulation is provided. Such sealing can be easily realized utilizing known devices such as magnetic seals. The speed of rotation is selected to provide a gas flow rate which minimizes the deposition of powder at locations from which it can slough off onto the growing rods. The optimum speed will depend on the size and shape of the reactor and composition of the circulating gas. Thus, for any given reactor, the best speed is determined by experimentation.

Figure 4:
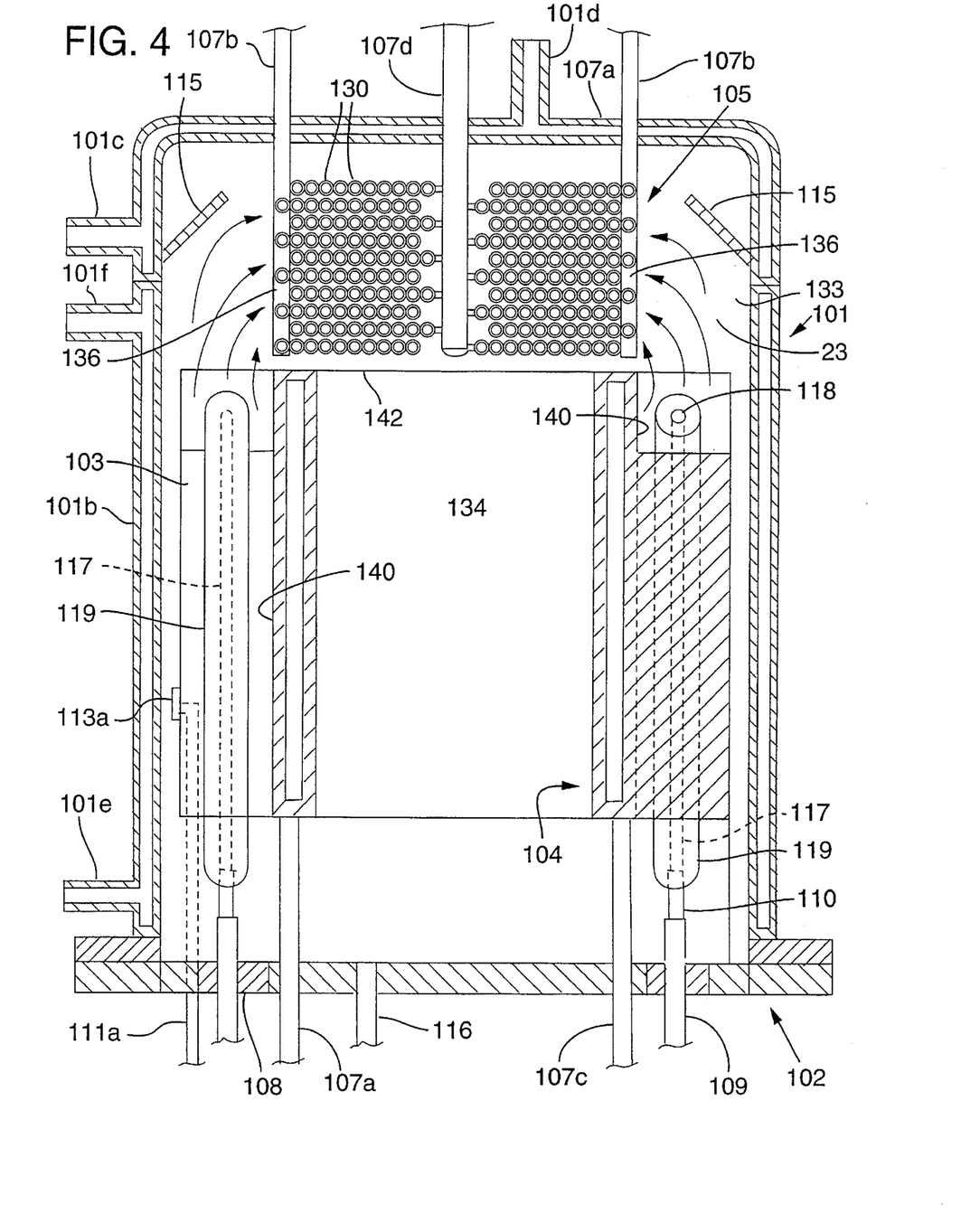
FIG. 4 is a schematic vertical sectional view showing a second reactor according to the present invention.

In the embodiment of FIG. 4, a verger-type cover or bell 101 and a round base plate 102 provide a reactor vessel. A cylindrical partition member 103, that is a heat exchanger or water jacket and that is shaped to define multiple reaction chambers 103, is provided inside a cylindrical space defined by the cover 101 and base plate 102. A powder catcher 105 is positioned at an elevation above the tops of the reaction chambers 103. The illustrated powder catcher is a cylindrical array of heat exchange tubes 130 that are concentrically arranged. The array is in the shape of a disk having a central vertical passageway 132. Multiple thin fins (not shown) may be attached to the tubes 130 to increase the area of the cooled surface that is provided by the powder catcher. The illustrated powder catcher 105 is positioned so that it is not directly over the reaction chambers 103. This arrangement reduces the small likelihood of agglomerated powder falling from the powder catcher into one of the reaction chambers. The arrangement is also advantageous in that an unobstructed region 133 is provided over the reaction chambers so that heated gas is free to rise up and away from the growing rods 119 at a rapid rate.

The water jacket 104 and powder catcher 105 are positioned and spaced such that gas which exits from the tops of the reaction chambers 103 flows through the array of tubes 130 and into the passageway 132. The passageway 132, along with a central passageway 134 defined by the water jacket 104, serves as gas downflow passageway. The reaction chambers 103 consist of cylindrical spaces arranged at equal intervals in the vicinity of the outer periphery of the water jacket 104. Openings leading from the outer periphery of the water jacket 104 to the reaction chambers 103 are provided for purpose of enabling the extraction of polycrystalline silicon rods which have been completely grown.

The cover 101 and the tubes 130 of the powder catcher 105 are at least partially hollow and serve as water cooled heat exchangers. The cover 101 is formed by connecting upper and lower cover sections 101a and 101b with each other. The lower surface of the upper cover section 101a serves as the reactor vessel ceiling. Provided in the upper cover section 101a are a cooling water inlet 101c and a cooling water outlet 101d. Provided in the lower cover section 101b are a cooling water inlet 101e and a cooling water outlet 101f. As it moves from the inlet 101c to the outlet 101d, cooling water flows through the space between the inner and outer walls of the cover. Connected to the bottom of the water jacket 104 are cooling water supply pipes 107a and 107c which extend from below through the base plate 102. Extending through the upper cover section 101a are water supply pipes 107b which provide cooling water to manifolds 136 for distribution into the tubes 130. Heated water from the tubes 130 is removed via a discharge pipe 107d which also extends through the upper cover section 101a. The water flowing through the water cooling jacket 104 and tubes 130 may be replaced by another fluid cooling or a heating medium.

Electrodes 109 extend from below through the base plate 102, through the intermediation of insulating members 108, and are arranged at positions corresponding to the centers of the reaction chambers 103. Chucks 110 are attached to the tips of the electrodes 109.

Resistant plates (not shown) can be arranged at appropriate intervals inside the reactor as explained with regard to the embodiment of FIGS. 1–3. The plates extend transversely to gas downflow passageways to regulate gas flow. Provided in the space above the water jacket 4 is are heat shield/deflector plates 115. The plates 115 are positioned so that gas which rises from the reaction chambers 103 is channeled into the powder catcher 105.

An exhaust pipe 116 extends through the base plate 102 and can be used to remove spent reactant gas. Reactant gas pipes 111a allow reactant gas to be evenly ejected into each reaction chamber through openings 113a on the surface of the water cooling jacket 104. To provide an even gas distribution, the openings are provided at multiple positions and at multiple elevations. Gas added at the higher elevations makes up for the depletion of silicon from the reactant gas that moves upwardly in the reaction chambers 103.

Polycrystalline silicon rods are produced the apparatus of FIG. 4 by positioning silicon starter filaments 117 are in the reaction chambers 103 where they are held by the chucks 110. Pairs of silicon starter filaments 117 are connected to each other at their upper ends through silicon bridges 118. Cooling water is circulated through the cover 101, the water jacket 104 and the powder catcher 105. The silicon starter filaments 117 are heated by directly supplying electricity thereto through the electrodes 109. Then, a silicon-bearing reactant gas is fed into the reactor through the reactant gas pipes 111a and the gas nozzles 113a. Then, while ascending inside the reaction chambers 103, which are heated by the silicon starter filaments 117, the gas reacts to deposit polycrystalline silicon 119 on the silicon starter filaments 117. Reactant gas which has moved upwards beyond the reaction chambers 103, in a laminar convection flow, next passes through the heat exchange tube array and along the wall surfaces of the powder catcher tubes 130, descends through the passageways 132 and 134, and then returns to the reaction chambers 103. A fan mechanism (not shown) can be located in or below the passageway 134.

The powder catcher 105 performs-the two functions of collecting silicon powder and effecting heat exchange. Accordingly, the temperature in the reaction chambers 103 can be independently regulated to achieve the best growth conditions for polycrystalline silicon rods. Since floating silicon powder collects on cool surfaces, such as on the walls of the powder catcher tubes 130, accumulation thereof on the walls of the reaction chambers 103 and the reactor ceiling section can be avoided to a large degree.

Figure 5:
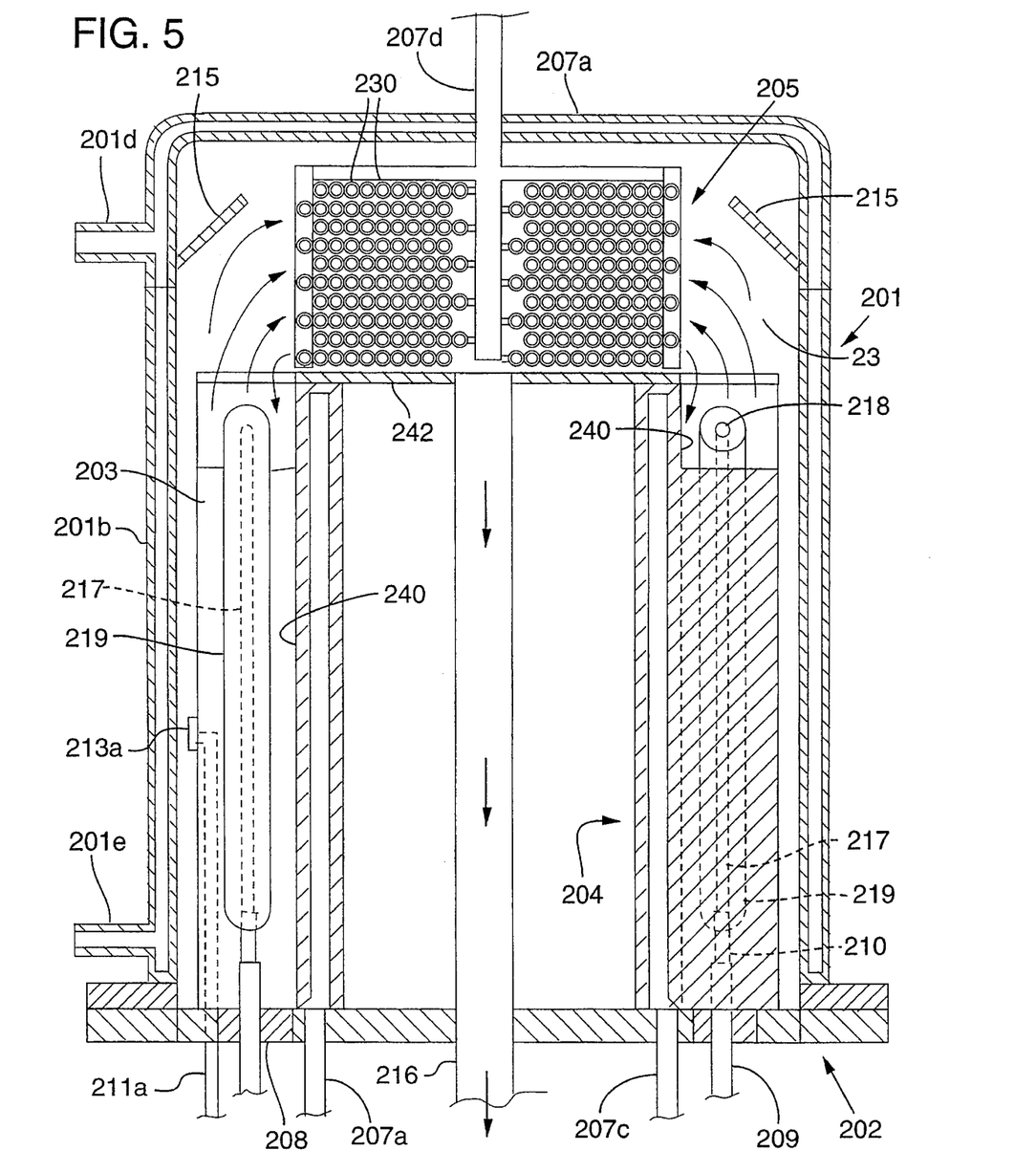
FIG. 5 is a schematic vertical sectional view showing a third reactor according to the present invention.

Another embodiment, as shown in FIG. 5, is closely related to the embodiment of FIG. 4, with like elements being similarly numbered, but incremented by 100 in FIG. 5. In the apparatus of FIG. 5, reactant gas moves upwardly from the reaction chambers 203 into a tube array of the powder catcher 205 where the gas is cooled and powder deposits. The cooled gas is not returned to the bottom of the reactor via a central passageway, but instead moves down from the powder catcher and descends along the cooled wall 240 of the water jacket 204. A top plate 242 is provided at the top of the water jacket 204 to direct gas back outwardly to the region above the reaction chambers 203. An exhaust pipe 216 extends through the base plate 202 and top plate 242, for removing spent reactant gas when necessary.

Figure 6:
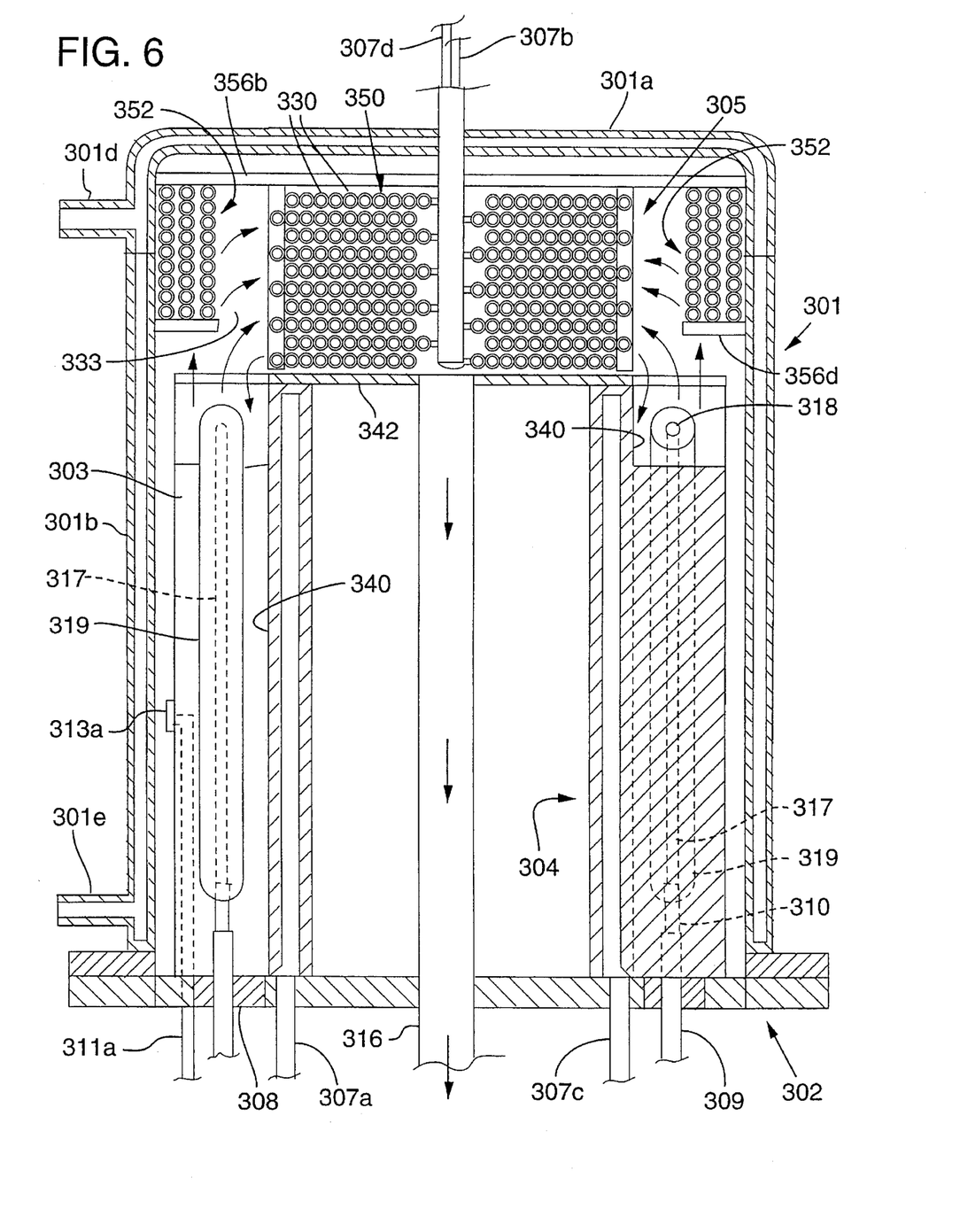
FIG. 6 is a schematic vertical sectional view showing a fourth reactor according to the present invention.

Yet another embodiment is shown in FIG. 6. This embodiment is closely related to the embodiment of FIG. 5, with like elements being similarly numbered, but incremented by 100 in FIG. 6. In the apparatus of FIG. 5, reactant gas moves upwardly from the reaction chambers 303 into a powder catcher 305 having two concentric tube arrays. An inner array 350 is similar to the tube array of FIGS. 4 and 5. An outer tube array 352 concentrically surrounds the inner array 350. The outer tube array 352 provides an additional surface for the deposit of powder. Most conveniently the inner and outer arrays are in fluid communication with one another so that a single source of cooled water can feed both arrays. In the illustrated embodiment cooling both a cooling water supply pipe 307*b* and a cooling water discharge pipe 307*d* enter the reactor through the same opening. And, both pipe are connected to both arrays by manifolds 356*b* and 356*d* respectively. e where the gas is cooled and powder deposits.

Having illustrated and described the principles of our invention, it should be apparent to those persons skilled in the art that such an invention may be modified in arrangement and detail without departing from such principles. For example the powder catcher used in the above described reactors could be constructed in a variety of configurations, including some combination of cooled tubes, cooled plates, and/or cooled wall surfaces, or the like. We claim as our invention all such modifications as come within the true spirit and scope of the following claims.

We claim:

1. A process for the production of polycrystalline silicon rods from a silicon-bearing gas, the process comprising:

providing a reactor vessel having an interior surface including a floor, a wall and a ceiling, the vessel containing a cooled partition with a wall which defines multiple reaction chambers and containing a powder catcher which is displaced from the reaction chambers, has a cooled wall, and is in the form of a heat exchange tube array;

positioning a starter filament in each reaction chamber where a polycrystalline silicon rod is to be grown;

heating the starter filaments;

passing a silicon-bearing reactant gas through the reaction chambers such that polycrystalline silicon deposits on the starter filaments and forms silicon powder due to the thermal decomposition of a silicon compound in the reactant gas; and passing the reactant gas, with entrained silicon powder, from the reaction chambers into contact with the cooled wall of the powder catcher.

2. The process as defined by claim 1, further comprising regulating the flow of the reactant gas by positioning a flow resistant plate along the path of reactant gas flowing inside the reactor vessel.

3. The process as defined by claim 1, further comprising inhibiting deposition of silicon powder on the ceiling of the reactor above the reaction chambers by positioning a metal or ceramic heat shield plate above the reaction chambers such that reactant gas exiting the reaction chambers is diverted from flowing directly to the ceiling of the vessel.

4. The process as defined by claim 1, further comprising:

providing the powder catcher in the shape of a cylinder; and injecting the reactant gas alongside and in a circumferential direction with respect to the powder catcher.

5. The process as defined by claim 1, further comprising maintaining the relationship of $T2 \leq T1 \leq T3$ where T1 is the wall temperature of the reaction chambers, T2 is the wall temperature of the powder catcher, and T3 is the reactor ceiling temperature.

6. The process as defined by claim 5, further comprising maintaining the temperature to be T1>25° C., T2<25° C., and T3>70° C.

7. A process for the production of polycrystalline silicon rods from a silicon-bearing gas, the process comprising:

providing a reactor vessel having an interior surface including a floor, a wall and a ceiling, the vessel containing a cooled partition with a wall which defines multiple reaction chambers and containing a powder catcher which is displaced from the reaction chambers, has a cooled wall, and is in the shape of a disk that defines a central vertical passageway and that is located at an elevation above the tops of the reaction chambers;

positioning a starter filament in each reaction chamber where a polycrystalline silicon rod is to be grown;

heating the starter filaments;

passing a silicon-bearing reactant gas through the reaction chambers such that polycrystalline silicon deposits on the starter filaments and forms silicon powder due to the thermal decomposition of a silicon compound in the reactant gas; and passing the reactant gas, with entrained silicon powder, from the reaction chambers into contact with the cooled wall of the powder catcher.

8. A process for the production of polycrystalline silicon rods from a silicon-bearing gas, the process comprising:

providing a reactor vessel having an interior surface including a floor, a wall, and a ceiling, the vessel containing (a) a cooled partition with a wall which defines multiple reaction chambers, (b) a powder catcher which is displaced from the reaction chambers, has a cooled wall, and is in the form of a heat exchange tube array, and (c) a recirculation fan positioned between the powder catcher and the reaction chambers;

positioning a starter filament in each reaction chamber where a polycrystalline silicon rod is to be grown;

heating the starter filaments;

passing a silicon-bearing reactant gas through the reaction chambers such that polycrystalline silicon deposits on the starter filaments and forms silicon powder due to the thermal decomposition of a silane gas in the reactant gas, the silane gas being selected from the group consisting of monosilane, disilane, and mixtures thereof;

passing the reactant gas, with entrained silicon powder, from the reaction chambers into contact with the cooled wall of the powder catcher; and operating the recirculation fan to move reactant gas from the vicinity of the powder catcher back into the reaction chambers.

9. The process as defined by claim 8, wherein a metal or ceramic heat shield plate is installed in the top section of the reactor.

10. The process as defined by claim 8, further comprising channeling all reactant gas in the vicinity of the powder catcher through the recirculation fan.

11. The process as defined by claim 8, further comprising inhibiting deposition of silicon powder on the ceiling of the reactor above the reaction chambers by positioning a metal or ceramic heat shield plate above the reaction chambers such that reactant gas exiting the reaction chambers is diverted from flowing directly to the ceiling of the vessel.

12. The process as defined by claim 8, further comprising:

providing the powder catcher in the shape of a cylinder; and injecting monosilane gas alongside and in a circumferential direction with respect to the powder catcher.

13. The process as defined by claim 8, further comprising maintaining the relationship of $T2 \leq T1 \leq T3$ where $T1$ is the wall temperature of the reaction chambers, $T2$ is the wall temperature of the powder catcher, and $T3$ is the reactor ceiling temperature.

14. The process as defined by claim 13, further comprising maintaining the temperature to be $T1>25°$ C., $T2<25°$ C., and $T3>70°$ C.

15. A process for the production of polycrystalline silicon rods from a silicon-bearing gas, the process comprising:

providing a reactor vessel having an interior surface including a floor, a wall, and a ceiling, the vessel containing (a) a cooled partition with a wall which defines multiple reaction chambers, and (b) a powder catcher which comprises a cooled wall provided by a heat exchange tube array in the shape of disk that defines a vertical passageway and which is displaced from and located at an elevation above the reaction chambers;

positioning a starter filament in each reaction chamber where a polycrystalline silicon rod is to be grown;

heating the starter filaments;

passing a silicon-bearing reactant gas through the reaction chambers such that polycrystalline silicon deposits on the starter filaments and forms silicon powder due to the thermal decomposition of a silane gas in the reactant gas, the silane gas being selected from the group consisting of monosilane, disilane, and mixtures thereof;

passing the reactant gas, with entrained silicon powder, from the reaction chambers into the tube array where the silicon powder deposits the cooled wall;

passing the reactant gas from the tube array into the passageway; and recirculating at least a portion of the reactant gas from the passageway into the reaction chambers.

* * * * *